United States Patent [19]
Lehmann

[11] Patent Number: 5,003,269
[45] Date of Patent: Mar. 26, 1991

[54] UNITY GAIN AMPLIFIER WITH HIGH SLEW RATE AND HIGH BANDWIDTH

[75] Inventor: Klaus Lehmann, Muehltal, Fed. Rep. of Germany

[73] Assignee: Burr-Brown Corporation, Tucson, Ariz.

[21] Appl. No.: 351,406

[22] Filed: May 12, 1989

[51] Int. Cl.⁵ .............................................. H03F 3/30
[52] U.S. Cl. ...................................................... 330/267
[58] Field of Search ................ 330/263, 265, 267, 288

[56] References Cited

U.S. PATENT DOCUMENTS

| | | | |
|---|---|---|---|
| 3,914,703 | 10/1975 | Stauffer | 330/17 |
| 4,394,625 | 7/1983 | Sakai | 330/267 |
| 4,433,305 | 2/1984 | Ozawa et al. | 330/296 |
| 4,502,020 | 2/1985 | Nelson et al. | 330/268 |
| 4,540,951 | 9/1985 | Ozawa et al. | 330/267 |
| 4,595,883 | 6/1986 | Nakayama | 330/255 |
| 4,628,279 | 12/1986 | Nelson | 330/257 |
| 4,629,998 | 12/1986 | Fujiwara | 330/304 |
| 4,639,685 | 1/1987 | Saller et al. | 330/263 |
| 4,780,689 | 10/1988 | Saller et al. | 330/267 |
| 4,791,383 | 12/1988 | Monticelli et al. | 330/265 |
| 4,833,424 | 5/1989 | Wright | 330/267 |

FOREIGN PATENT DOCUMENTS 4106  1/1989  Japan ................................. 330/252

OTHER PUBLICATIONS

*Wireless World*, Sep. 1976.
"Offset-Compensated Emitter-Follower", *IEEE Journal of Solid-State Circuits*, Jun. 1971, pp. 127–128.

*Primary Examiner*—James B. Mullins
*Attorney, Agent, or Firm*—Cahill, Sutton & Thomas

[57] ABSTRACT

A unity gain amplifier of the Diamond follower type provides the combination of negligible input offset voltage, high slew rate, and high bandwidth by providing first and second opposite polarity current mirror circuits which respond to currents flowing through first and second input transistors to boost current available to charge parasitic capacitances during fast rise times and fast fall times of an input pulse. The rapid charging and discharging of the parasitic capacitances eliminates degradation in the rise and fall times of an output pulse produced by the unity gain amplifier.

13 Claims, 2 Drawing Sheets

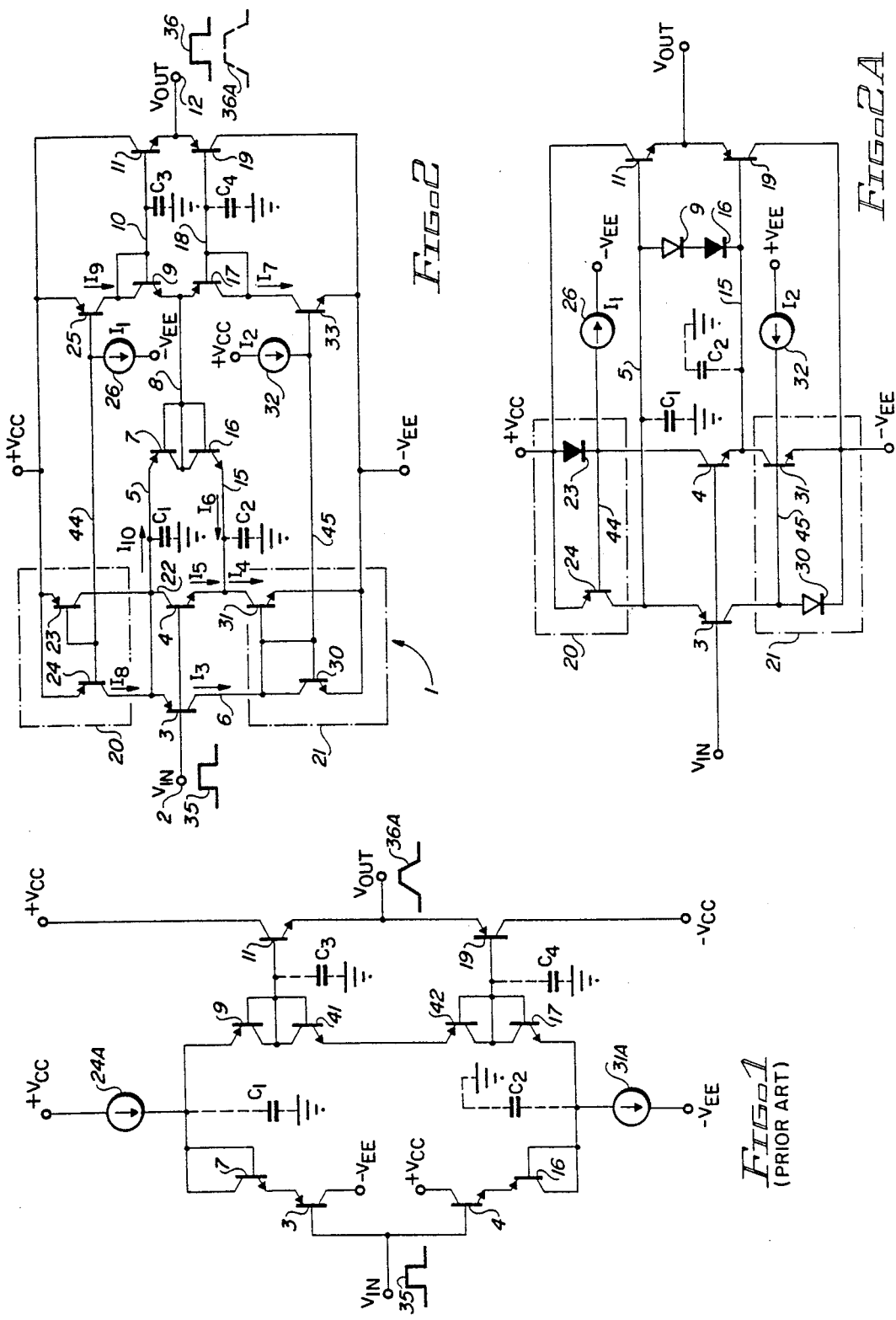

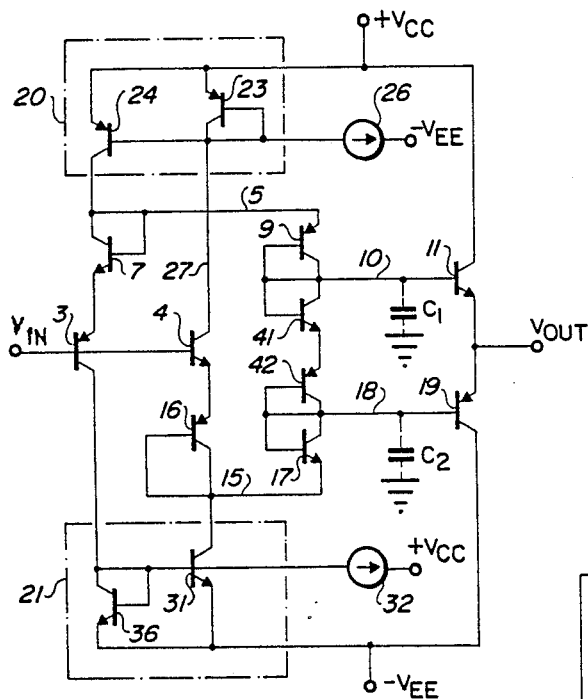
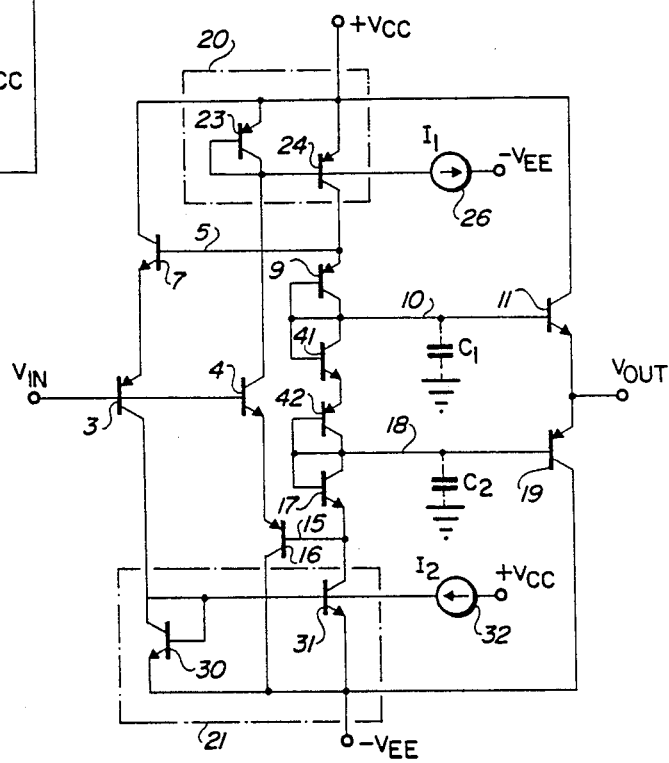
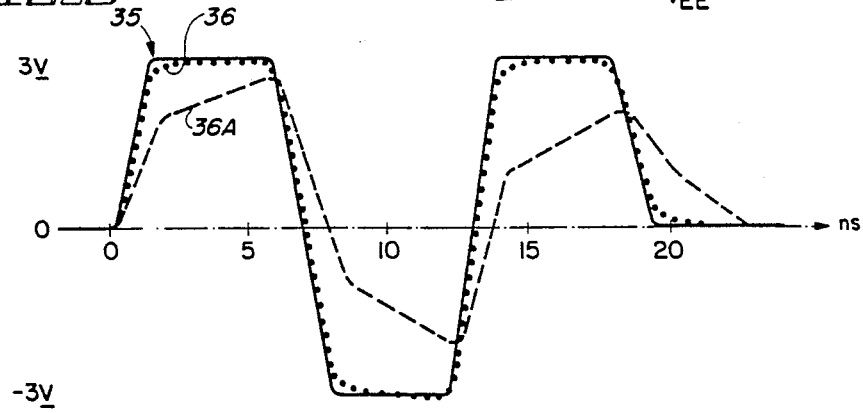

UNITY GAIN AMPLIFIER WITH HIGH SLEW RATE AND HIGH BANDWIDTH

BACKGROUND OF THE INVENTION

The invention relates to unity gain amplifiers of the type commonly referred to as diamond followers, and more particularly to improvements that provide the combination of improved input offset voltage, high slew rate, and high bandwidth.

U.S. Pat. No. 4,639,685 (Saller et al.) issued Jan. 27, 1987 discloses improvements in a standard diamond follower circuit to overcome the input offset problem of the basic diamond follower circuit, which is shown in FIG. 1 of the Saller et al. patent.

FIG. 1 of the present patent application shows the circuit in FIG. 4 of the Saller et al. reference. Saller et al.'s contribution in developing that circuit is the recognition that the input offset voltage $V_{IN}$-$V_{OUT}$ can be made equal to zero by providing two upward level shifts equal to the $V_{BE}$ voltages of a PNP diode-connected transistor and an NPN diode-connected transistor and also providing two downward level shifts equal to the $V_{BE}$ voltages of a PNP diode-connected transistor and an NPN diode-connected transistor in each of the two signal paths from $V_{IN}$ to $V_{OUT}$. In FIG. 1, the offset voltage is equal to the $V_{BE}$ voltage of PNP input transistor 3 plus the $V_{BE}$ voltage of NPN transistor 7 minus the $V_{BE}$ voltage of PNP transistor 9 minus the $V_{BE}$ voltage of NPN output transistor 11. This offset voltage is equal to zero because the $V_{BE}$ voltages of PNP transistors 3 and 9 are equal and the $V_{BE}$ voltages of NPN transistors 7 and 11 are equal, assuming that the transistor geometries and current densities are properly matched. The offset voltage in the circuit of FIG. 1 also is equal to the sum of the $V_{BE}$ voltages of NPN transistor 4 and PNP transistor 16 minus the sum of the $V_{BE}$ voltages of NPN transistor 17 and PNP transistor 19.

A major problem with the input-offset-compensated circuit of FIG. 1 is that its slew rate is very poor because when the input transistor 3 is switched off by a fast rising transition of $V_{IN}$, the constant current source 24A must charge up substantial parasitic capacitances C1 and C3, causing considerable delay in the response of $V_{OUT}$. Similarly, if input transistor 4 is switched off by a rapidly falling transition of $V_{IN}$, constant current source 31A must discharge substantial parasitic capacitances C2 and C4, resulting in considerable delay of the corresponding negative going downward transition of $V_{OUT}$. The sloped leading and trailing edges of $V_{OUT}$ curve 36A in FIG. 1 indicates a poor slew rate that the circuit would have in response to a $V_{IN}$ pulse 35 applied to input conductor 2 (in contrast to the steep slopes of the leading and trailing edges of waveform 36 in FIG. 2, which indicates high slew rate and high bandwidth achieved by the improvement of the present invention).

There is a substantial unmet need for an input-offset-compensated diamond follower unity gain amplifier circuit having a high slew rate and wide bandwidth.

SUMMARY OF THE INVENTION

Accordingly, it is an object of the invention to provide an improved diamond follower type of unity gain amplifier which has a high slew rate and wide bandwidth.

It is another object of the invention to provide an improved unity gain amplifier circuit that is input-offset-compensated and has high slew rate and wide bandwidth.

Briefly described, and in accordance with one embodiment thereof, the invention provides a diamond follower type of unity gain buffer which is input-offset-compensated and provides a high slew rate by utilizing first and second current mirror circuits receiving as a control current input the collector current of one of the input transistors and supplying a controlled current to supply it to charge up parasitic capacitances and the signal paths to the output transistors of the diamond follower circuit. In the described embodiments, the unity gain amplifier includes a unity gain amplifier having a PNP input transistor, an NPN input transistor, a PNP output transistor, and an NPN output transistor, each having an emitter, a base, and a collector. The bases of the PNP input transistor and an NPN input transistor receive an input signal. The NPN output transistor and PNP output transistor are coupled to an output conductor to produce an output signal. In an embodiment which essentially eliminates input offset voltage, a first PNP transistor and a first NPN transistor are coupled between the PNP input transistor and the NPN output transistor to produce a PNP $V_{BE}$ voltage drop and an NPN $V_{BE}$ voltage rise to offset a PNP $V_{BE}$ voltage rise of the PNP input transistor and an NPN $V_{BE}$ voltage drop of the NPN output transistor, respectively. A second PNP transistor and a second NPN transistor are coupled between the NPN input transistor and the PNP output transistor to produce a PNP $V_{BE}$ voltage drop and an NPN $V_{BE}$ voltage rise to offset a PNP $V_{BE}$ voltage rise of the PNP output transistor and an NPN $V_{BE}$ voltage drop of the NPN input transistor, respectively. In each of the embodiments, a first current mirror circuit includes a first current output transistor and control transistor coupled to the collector of the NPN input transistor to supply increased current to charge parasitic capacitance in a first signal path including emitter-base junctions of the PNP input transistor and the NPN output transistor in response to a positive-going transition of the input signal. In the input offset compensated embodiments, the first signal path also includes the first NPN transistor and the first PNP transistor. A second current mirror circuit includes a second current output transistor and a second control transistor coupled to the collector of the PNP input transistor to supply increased current to discharge parasitic capacitance in a second signal path including emitter-base junctions of the NPN input transistor and the PNP output transistor. In the input offset compensated embodiments, the second signal path includes the second PNP transistor and the second NPN transistor. A first bias current source is coupled to the collector and base of the first control transistor to provide a bias current thereto in order to minimize coupling cross-talk from the input signal to other external circuits. A second bias current source is similarly coupled to the second control transistor.

BRIEF DESCRIPTION OF THE DRAWINGS

FIG. 1 is a schematic diagram of a prior art offset-compensated diamond follower circuit.

FIG. 2 is a schematic diagram of an offset-compensated diamond follower circuit of the present invention with current mirror feedback to improve slew rate and bandwidth.

FIG. 2A is a schematic diagram of a non-compensated diamond follower circuit of the present invention with current mirror feedback to improve slew rate and bandwidth.

FIG. 3 is a schematic circuit diagram of another offset-compensated diamond follower circuit of the invention.

FIG. 4 is a schematic diagram of another offset-compensated, high slew rate amplifier of the present invention.

FIG. 5 is a diagram useful in explaining the advantages of the input-offset-compensated high slew rate diamond follower amplifiers of FIGS. 2-4.

DETAILED DESCRIPTION OF THE PREFERRED EMBODIMENTS

Referring to FIG. 2, modified diamond follower circuit 1 includes an input terminal 2 to which an input voltage $V_{IN}$ is applied. $V_{IN}$ can be a pulse waveform 35 having very fast rise times and fall times, of approximately one nanosecond. $V_{IN}$ is applied to the bases of PNP transistor 3 and NPN transistor 4 by conductor 2. The emitter of transistor 3 is connected by conductor 5 to the collector of PNP current mirror output transistor 24 and to the emitter of PNP transistor 7. The collector of transistor 3 is connected by conductor 6 to the base and collector of NPN current mirror control transistor 30, the base of current mirror output transistor 31, and the base of NPN transistor 33. The emitters of transistors 30, 31, and 33 are connected to $-V_{EE}$. The collector of transistor 31 is connected by conductor 15 to the emitter of input transistor 4 and to the emitter of diode-connected NPN transistor 16.

The collector of input transistor 4 is connected by conductor 22 to the base and collector of PNP current mirror control transistor 23, the base of transistor 24, and to the base of PNP current mirror output transistor 25. The emitters of transistors 23, 24, and 25 are connected to $+V_{CC}$. A current source 26 producing a constant current $I_1$ is connected between $-V_{EE}$ and conductor 44. A current source 32 producing a constant current $I_2$ is connected between $+V_{CC}$ and conductor 45.

The collector of current mirror output transistor 25 is connected by conductor 10 to the base and collector of NPN transistor 9 and the base of output NPN transistor 11. The emitter of transistor 9 is connected by conductor 8 to the base and collector of transistor 16 and to the emitter of PNP transistor 17. The base and collector of PNP transistor 17 are connected by conductor 18 to the collector of current mirror output transistor 33 and the base of PNP output transistor 19. The collector of output transistor 11 is connected to $+V_{CC}$ and the collector of output transistor 19 is connected to $-V_{EE}$.

A current $I_3$ flows through the collectors of transistors 3 and 30, assuming negligible base currents. $I_4$ flows through the collector of transistor 31. $I_5$ flows through the collectors of transistors 4 and 23, assuming negligible base currents. $I_6$ flows through transistor 16. $I_7$ flows through the collectors of transistors 17 and 33. $I_8$ flows through the collector of transistor 24. $I_9$ flows through the collectors of transistors 25 and 9. $I_{10}$ flows through transistor 7.

The best "tuning" for the circuit of FIG. 2 occurs when the geometries of all corresponding transistors are matched or scaled so that $V_{BE}$ of like transistors are matched for identical collector currents. For example, the quiescent current values could be given by the following table.

| $I_1$ | $I_2$ | $I_3$ | $I_4$ | $I_5$ | $I_6$ | $I_7$ | $kI_8$ | $I_9$ | $I_{10}$ |
|---|---|---|---|---|---|---|---|---|---|
| 1ma | 1ma | 1ma | 2ma | 1ma | 1ma | 1ma | 2ma | 1ma | 1ma |

If a fast $V_{IN}$ pulse 35 then is applied to the bases of input transistors 3 and 4, this will tend to turn transistor 3 off and to turn transistor 4 on harder. The portion of $I_8$ flowing into the emitter of transistor 3 decreases to zero, and all of the approximately 20 milliamperes of $I_8$ flows through conductor 5 to charge up parasitic capacitor C1 and into the emitter of transistor 7.

Meanwhile, $I_3$ decreases to nearly zero, causing the current $I_4$ of current mirror 21 to also fall to nearly zero, and also causing $I_7$ to fall to nearly zero.

Transistor 4, which is being turned on harder, causes $I_5$ to sharply increase since $I_4$ has fallen to zero, and the increased $I_5$ flows through conductor 15, charging up parasitic capacitor C2 and causing $I_6$ to decrease.

The voltage on conductor 8 therefore rises very rapidly. The increased currents $I_8$ and $I_9$ produced by transistors 24 and 25 in response to the increased current produced in current mirror control transistor 23 (due to the increased value of $I_5$) increase the speed of charging parasitic capacitors C1 and C3, respectively. The decreased value of $I_7$, in conjunction with the increased values of $I_8$ and $I_{10}$, causes rapid charging of parasitic capacitor C4, thereby aiding the rapid rise of the voltage on conductor 18. Consequently, a very fast rise time is produced in the $V_{OUT}$ voltage waveform 36 on conductor 12.

Similarly, when the falling edge of $V_{IN}$ pulse 35 occurs, it tends to turn off NPN transistor 4 and turn PNP transistor 3 on harder. The result is an increase in $I_3$ flowing in current mirror control transistor 30, and consequently increases in current mirror output transistors $I_4$ and $I_7$, accompanied by a reduction of both $I_5$ and the current flowing in current mirror control transistor 23, resulting in reductions in $I_8$ and $I_9$. The increased current $I_4$ is almost entirely available to discharge parasitic capacitor C2. The increased value of $I_7$ rapidly discharges parasitic capacitor C4. $I_{10}$ is decreased. $I_6$ is increased, increasing the current through transistors 9 and 16, discharging parasitic capacitor C3. The increased values of $I_6$ and $I_7$ increase the currents flowing through transistor 7, helping to rapidly discharge parasitic capacitors C1 and C3. Consequently, the voltages on conductors 10 and 18 fall rapidly, and the trailing edge of the $V_{OUT}$ waveform on conductor 10 fall sharply.

The circuit of FIG. 2 thus provides the combination of advantages including high bandwidth and slew rate and accurate input offset voltage compensation. The accurate offset voltage compensation occurs because the signal path from $V_{IN}$ to $V_{OUT}$ through the emitter base junctions of transistors 3, 7, 9, and 11 includes both an upward and a downward PNP $V_{BE}$ shift, resulting in a net offset of zero and an upward and a downward NPN $V_{BE}$ shift. Similarly, the signal path from $V_{IN}$ to $V_{OUT}$ through the emitter base junctions of transistors 4, 16, 17, and 19 includes a downward NPN $V_{BE}$ shift through transistor 4 and a matching upward NPN $V_{BE}$ shift through transistor 16, and a downward PNP $V_{BE}$ shift through transistor 17 which is precisely offset by an upward PNP $V_{BE}$ shift through transistor 19, resulting in a net offset of zero. The current mirrors 20 and 21 respond to currents in the collectors of the input transistors 3 and 4 to supply increased charging currents for the parasitic capacitances and thereby improve bandwidth and slew rate of the diamond follower circuit.

FIG. 2A shows a modified diamond follower circuit including the current mirrors 20 and 21 of FIG. 2, but excluding the connection of transistors 7, 9, 16, and 17 as shown in the signal paths in FIG. 2. Instead, conductor 5 is connected to the base of transistor 11, conductor 15 is connected to the base of transistor 19, and transistors 7, 16, 25, and 33 are omitted. The operation of the current mirrors is identical to that described above with respect to FIG. 2, and the benefits of the high slew rate and high bandwidth are achieved. This circuit will be preferred for applications which do not require input offset voltage.

It should be appreciated that current sources 26 and 32 are normally implemented using current mirror output transistors which have a collector-to-base parasitic capacitance, and that only small amounts of the rising and falling edge transitions of $V_{IN}$ pulse 35 are coupled through such collector-to-base parasitic capacitance onto current mirror bias voltage conductors 44 and 45. As a result, very little cross-talk gets introduced onto the current sources 26 and 37 and their external biasing circuits in response to $V_{IN}$. This avoids amplification of such cross-talk by other current source output transistors that might also be biased by the same biasing circuits. (Nevertheless, the circuit of FIG. 2 would function properly if current source 26 were connected between $+V_{CC}$ and conductor 5 and current source 32 were connected between $-V_{EE}$ and conductor 15.) The above biasing technique with current sources 26 and 32 also has the advantage that it does not increase and contribute to imbalances in parasitic capacitances C1 and C2, and therefore helps avoid decreases and imbalances in the slew rates of the circuit of FIGS. 2, 2A, 3, and 4.

The simulated performance of the circuit of FIG. 2 is shown in the waveform of FIG. 5, wherein it is obvious that both the fast rising and falling edges of the $V_{OUT}$ waveform 36 track very precisely with the rising and falling edges of $V_{IN}$ waveform 35.

FIG. 3 shows another embodiment of the invention which is quite similar to the prior art circuit of FIG. 1, except that the current sources 24A and 31A have been replaced by current mirror circuits 20 and 21, respectively. Alternatively, current sources 26 and 32 could be connected to conductors 5 and 15, respectively, but increased bias cross-talk coupling would result. In the circuit of FIG. 3, the current mirrors 20 and 21 work in cooperation with input transistors 3 and 4 in response to positive-going and negative-going transitions of $V_{IN}$ pulses in essentially the same manner as in FIG. 2, so that the amount of current available to charge parasitic capacitances C1 and C2 in response to a positive-going edge of $V_{IN}$ pulse 35 is greatly increased over that of the circuit of FIG. 1. The amount of current available to discharge the parasitic capacitors C1 and C2 in response to a negative-going edge of $V_{IN}$ pulse 35 also is greatly increased. The slew rate and bandwidth of the circuit of FIG. 3 therefore is greatly improved over that of FIG. 1, while achieving the same benefit of essentially zero input offset voltage.

Referring to FIG. 4, the modified diamond follower circuit is identical to that of FIG. 3, except that transistor 7 has its collector connected to $+V_{CC}$ instead of to the collector of current mirror output transistor 24 and has its base connected only to the collector of current mirror output transistor 24 and to the emitter of diode-connected transistor 9 by means of conductor 5. Transistor 16 has its collector connected to $-V_{EE}$ only, and has its base connected by conductor 15 only to the collector of current mirror output transistor 31 into the emitter of diode-connected transistor 17. This structural difference causes transistors 7 and 16 to function as high input impedance buffers with low output impedance at all practical frequencies. Therefore, transistors 7 and 16 respond very quickly to feedback through the string of diode-connected transistors 9, 41, 42, and 17 when input transistors 3 and 4 are rapidly turned on or off during rapid leading edge and trailing edge transitions of $V_{IN}$ input pulses.

In the circuit of FIG. 3, high frequency variations in the current supplied to the emitter of input transistor 3 are supplied by parasitic capacitance C1 (into which all of the parasitic capacitance associated with circuit nodes 5 and 10 have been "lumped" for convenience). Similarly, high frequency variations in the current supplied to the emitter of input transistor 4 are supplied by parasitic capacitance C2 (into which all of the parasitic capacitance associated with circuit nodes 15 and 18 have been "lumped"). This "charge controlled" structure tends to limit the slew rate and bandwidth of the circuit despite the above-described performance of current mirrors 20 and 21, and also causes the difference between slew rates for positive-going and negative-going signals to be a function of the imbalance in the parasitic capacitances C1 and C2, which is undesirable.

In contrast, the circuit of FIG. 4 provides a "voltage controlled" structure in which emitter follower transistor 7, instead of C1, supplies the high frequency variation in the emitter current of input transistor 3, and emitter follower transistor 16, instead of C2, supplies the high frequency variations in the emitter current of input transistor 4. This substantially improves the slew rate and bandwidth of the circuit of FIG. 4 over that of FIG. 3, and prevents imbalances in the parasitic capacitances C1 and C2 from producing imbalances in the slew rates for high frequency positive-going and negative-going signal changes.

Thus, the above-described embodiments of the invention provide the benefits of greatly increased slew rate and bandwidth over the closest prior diamond follower type unity gain amplifiers while providing the very low input offset voltage of the circuits disclosed in the Saller et al. patent.

While the invention has been described with reference to a particular embodiment thereof, those skilled in the art will be able to make the various modifications to the described embodiments of the invention without departing from the true spirit and scope of the invention.

What is claimed is:

1. A unity gain amplifier, comprising in combination:
   (a) a PNP input transistor, an NPN input transistor, a PNP output transistor, and an NPN output transistor, each having an emitter, a base, and a collector, the bases of the PNP input transistor and the NPN input transistor receiving an input signal, the NPN output transistor and the PNP output transistor being coupled to an output conductor to produce an output signal;
   (b) first means for coupling the emitter of the PNP input transistor to the base of the NPN output transistor;

(c) second means for coupling the emitter of the NPN input transistor to the base of the PNP output transistor;

(d) first current mirror means, including a first control transistor coupled to the collector of the NPN input transistor, for supplying increased current directly into a first parasitic capacitance associated with the first coupling means in response to a positive-going transition of the input signal;

(e) second current mirror means, including a second control transistor coupled to the collector of the PNP input transistor, for sinking increased current directly from a second parasitic capacitance associated with the second coupling means in response to a negative-going transition of the input signal;

(f) first and second diodes coupled in series between the bases of the NPN output transistor and the PNP output transistor, current flowing from the first current mirror means also flowing through the first and second diodes to the second current mirror means and biasing both the NPN output transistor and the PNP output transistor to an ON condition.

2. The unity gain amplifier of claim 1 wherein the first means includes a first conductor connecting the emitter of the PNP input transistor to the base of the NPN output transistor, and the second means includes a second conductor connecting the emitter of the NPN input transistor to the base of the PNP output transistor.

3. A unity gain amplifier, comprising in combination:
(a) a PNP input transistor, an NPN input transistor, a PNP output transistor, and an NPN output transistor, each having an emitter, a base, and a collector, the bases of the PNP input transistor and the NPN input transistor receiving an input signal, the NPN output transistor and the PNP output transistor being coupled to an output conductor to produce an output signal;
(b) a first PNP transistor and a first NPN transistor coupled between the PNP input transistor and the NPN output transistor to produce a PNP $V_{BE}$ voltage drop and an NPN $V_{BE}$ voltage rise to offset a PNP $V_{BE}$ voltage rise to the PNP input transistor and an NPN $V_{BE}$ voltage drop of the NPN output transistor, respectively;
(c) a second PNP transistor and a second NPN transistor coupled between the NPN input transistor and the PNP output transistor to produce a PNP $V_{BE}$ voltage drop and NPN $V_{BE}$ voltage rise to offset a PNP $V_{BE}$ voltage rise of the PNP output transistor and an NPN $V_{BE}$ voltage drop of the NPN input transistor, respectively;
(d) first current mirror means, including a first control transistor coupled to the collector of the NPN input transistor, for supplying increased current to charge a parasitic capacitance in a first signal path including emitter base junctions of the PNP input transistor, the first NPN transistor, the first PNP transistor, and the NPN output transistor in response to a positive-going transition of the input signal;
(e) second current mirror means, including a second control transistor coupled to the collector of the PNP input transistor, for supplying increased current to discharge a parasitic capacitance in a second signal path including emitter base junctions of the NPN input transistor, the second PNP transistor, the second NPN transistor, and the PNP output transistor in response to a negative-going transition of the input signal.

4. The unit gain amplifier of claim 3 wherein the first control transistor is a PNP first current mirror control transistor having a base and collector connected to the collector of the NPN input transistor, and the first current mirror means includes a PNP first current mirror output transistor having an emitter and base connected to an emitter and the base of the first control transistor, respectively, and a collector coupled to the emitter of the PNP input transistor, and the second control transistor is an NPN second current mirror control transistor having a base and collector connected to the collector of the PNP input transistor, and the second current mirror means includes an NPN second current mirror output transistor having an emitter and base connected to an emitter and the base of the second current mirror control transistor, respectively, and a collector coupled to the emitter of the NPN input transistor.

5. The unity gain amplifier of claim 4 wherein the unity gain amplifier includes a first current source connected to the collector and base of the first control transistor to draw a first current out of the collector and base of the first control transistor, and a second current source connected to the collector and base of the second control transistor to supply a second current into the collector and base of the second control transistor.

6. The unity gain amplifier of claim 3 wherein an emitter of the first PNP transistor is connected to an emitter of the PNP input transistor, a collector and base of the first PNP transistor are connected to a collector and base of the second NPN transistor, and an emitter of the first NPN transistor is connected to an emitter of the second PNP transistor, a collector and base of the first NPN transistor are connected to the base of NPN output transistor, and a collector and base of the second PNP transistor are connected to the base of the PNP output transistor.

7. The unity gain amplifier of claim 6 wherein the collector and base of the first NPN transistor are connected to the first current mirror means, and the collector and base of the second PNP transistor are connected to the second current mirror means.

8. The unity gain amplifier of claim 3 wherein the first NPN transistor has an emitter connected to the emitter of the PNP input transistor and a base connected to an emitter of the first PNP transistor, and a collector and base of the first PNP transistor are connected to a base of the NPN output transistor, and wherein an emitter of the second PNP transistor is connected to the emitter of the NPN input transistor, and wherein a base of the second PNP transistor is connected to an emitter of the second NPN transistor, a collector and base of the second NPN transistor being connected to a base of the PNP output transistor.

9. The unity gain amplifier of claim 8 wherein the collector and base of the first NPN transistor are connected to the first current mirror means, and wherein the collector and base of the second PNP transistor are connected to the second current mirror means, and wherein the collector and base of the first PNP transistor are connected to a collector and base of a third NPN transistor having an emitter connected to an emitter of a third PNP transistor having a collector and base connected to the collector and base of the second NPN transistor.

10. The unity gain amplifier of claim 8 wherein the collector of the first NPN transistor is connected to a first reference voltage conductor, and wherein the collector of the second PNP transistor is connected to a second reference voltage conductor, and wherein the collector and base of the first PNP transistor are connected to a collector and base of a third NPN transistor having an emitter connected to an emitter of a third PNP transistor having a collector and base connected to the collector and base of the second NPN transistor.

11. A method of improving slew rate and bandwidth of a unity gain amplifier including a PNP input transistor, an NPN input transistor, a PNP output transistor, and an NPN output transistor, first coupling means for coupling an emitter of the PNP input transistor to a base of the PNP output transistor, and second coupling means for coupling an emitter of the NPN input transistor to a base of the PNP output transistor, the method comprising the steps of:

(a) applying a fast-rising transition of an input signal to bases of the PNP and NPN input transistors, reducing a $V_{BE}$ voltage of the PNP input transistor and reducing a collector current thereof, and simultaneously increasing a $V_{BE}$ voltage of the NPN input transistor and increasing a collector current thereof;

(b) causing the collector current of the NPN input transistor to flow through a control transistor in a first current mirror, thereby increasing an output current of the first current mirror;

(c) supplying the output current of the first current mirror to the first coupling means to rapidly charge a parasitic capacitance of the first coupling means, to thereby produce a fast-rising transition of an output signal in response to the fast-rising transition of the input signal;

(d) applying a fast-falling transition of the input signal to the bases of the PNP and NPN input transistors, thereby increasing a $V_{BE}$ voltage of the PNP input transistor and increasing a collector current thereof, and decreasing a $V_{BE}$ voltage of the NPN input transistor and decreasing a collector current thereof;

(e) causing the collector current of the PNP input transistor to flow through a control transistor of a second current mirror, thereby increasing an output current thereof;

(f) causing the output current of the second current mirror to discharge a parasitic capacitance associated with the second coupling means to thereby produce a fast-falling transition of the output signal in response to the fast-falling transition of the input signal;

(g) establishing a first bias current in the control transistor of the first current mirror by coupling a first constant current source to the control transistor of the first current mirror and causing the first bias current to flow in the first current source;

(h) establishing a second bias current to flow in the control transistor of the second current mirror by coupling a second constant current source to the control transistor of the second current mirror and causing the second bias current to flow in the control transistor of the second current mirror;

(i) compensating the input offset voltage of the unity gain circuit by connecting a first NPN transistor and first PNP transistor between the emitter of the PNP input transistor and the base of the NPN output transistor to produce an NPN $V_{BE}$ voltage rise and a PNP $V_{BE}$ voltage drop in a path between the emitter of the PNP input transistor and the base of the NPN output transistor, and also connecting a second PNP transistor and a second NPN transistor between the emitter of the NPN input transistor and the base of the PNP output transistor to produce a PNP $V_{BE}$ voltage drop and NPN $V_{BE}$ voltage rise in a path between the emitter of the NPN input transistor and the base of the PNP output transistor.

12. The method of claim 11 wherein the first NPN transistor has its emitter connected to the emitter of the PNP input transistor, its base connected to the emitter of the first PNP transistor, and its collector connected to a positive supply voltage conductor, whereby high frequency current variations in the emitter current of the PNP input transistor are supplied from the positive supply voltage conductor rather than a first parasitic capacitance, and wherein the second PNP transistor has an emitter connected to the emitter of the NPN input transistor, a collector connected to a negative supply voltage conductor, and a base connected to the emitter of the second NPN transistor, whereby high frequency variations in an emitter current of the NPN input transistor are supplied from negative supply voltage conductor rather than a second parasitic capacitance.

13. A method of improving slew rate and bandwidth of a unity gain amplifier including a PNP input transistor, an NPN input transistor, a PNP output transistor, and an NPN output transistor, first coupling means for coupling an emitter of the PNP input transistor to a base of the NPN output transistor, and second coupling means for coupling an emitter of the NPN input transistor to a base of the PNP output transistor, the method comprising the steps of:

(a) applying a fast-rising transition of an input signal to bases of the PNP and NPN input transistors, reducing a $V_{BE}$ voltage of the PNP input transistor and reducing a collector current thereof, and simultaneously increasing a $V_{BE}$ voltage of the NPN input transistor and increasing a collector current thereof;

(b) causing the collector current of the NPN input transistor to flow through a control transistor in a first current mirror, thereby increasing an output current of the first current mirror;

(c) supplying a first portion of the output current of the first current mirror directly into a first parasitic capacitance associated with the first coupling means, to rapidly charge the first parasitic capacitance and thereby produce a fast-rising transition of an output signal in response to the fast-rising transition of the input signal and causing a second portion of the output current of the first current mirror to flow through a first diode and a second diode;

(d) applying a fast-falling transition of the input signal to the bases of the PNP and NPN input transistors, thereby increasing a $V_{BE}$ voltage of the PNP input transistor and increasing a collector current thereof, and decreasing a $V_{BE}$ voltage of the NPN input transistor and decreasing a collector current thereof;

(e) causing the collector current of the PNP input transistor to flow through a control transistor of a second current mirror, thereby increasing an output current thereof;

(f) sinking a first portion of the output current of the second current mirror directly out of a second parasitic capacitance associated with the second coupling means to rapidly discharge the second parasitic capacitance and thereby produce a fast-falling transition of the output signal in response to the fast-falling transition of the input signal, and causing a second portion of the output current of the second current mirror to flow through the first and second diodes to bias the PNP output transistor and the NPN output transistor.

* * * * *